(12) United States Patent
Kim et al.

(10) Patent No.: US 11,800,672 B2
(45) Date of Patent: Oct. 24, 2023

(54) TOWER-SHAPED SUPPORT DEVICE

(71) Applicant: LS ELECTRIC CO., LTD., Anyang-si (KR)

(72) Inventors: Min-Jee Kim, Anyang-si (KR); Sang-Hoon Lee, Anyang-si (KR); Chae-Yoon Bae, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 48 days.

(21) Appl. No.: 17/268,803

(22) PCT Filed: Aug. 13, 2019

(86) PCT No.: PCT/KR2019/010295
§ 371 (c)(1),
(2) Date: Feb. 16, 2021

(87) PCT Pub. No.: WO2020/036411
PCT Pub. Date: Feb. 20, 2020

(65) Prior Publication Data
US 2021/0360810 A1    Nov. 18, 2021

(30) Foreign Application Priority Data

Aug. 17, 2018 (KR) .................. 10-2018-0096082
Aug. 17, 2018 (KR) .................. 10-2018-0096084

(51) Int. Cl.
*H05K 7/02* (2006.01)

(52) U.S. Cl.
CPC .................................... *H05K 7/02* (2013.01)

(58) Field of Classification Search
CPC ............. H05K 7/02; H01C 1/01; H01C 13/02
See application file for complete search history.

(56) References Cited

U.S. PATENT DOCUMENTS 1,653,070 A * 12/1927 Smith .................. B23K 9/1006
                                                        338/136
3,858,149 A * 12/1974 Kirilloff .................. H01C 1/01
                                                        338/315
(Continued)

FOREIGN PATENT DOCUMENTS

CN          2002033201 A      1/2002
CN           102468649 A      5/2012
(Continued)

OTHER PUBLICATIONS

European Search Report for related European Application No. 198500003.5; dated Oct. 14, 2021; (6 pages).
(Continued)

*Primary Examiner* — Anthony M Haughton
*Assistant Examiner* — Theron S Milliser
(74) *Attorney, Agent, or Firm* — K&L Gates LLP

(57) ABSTRACT

The present disclosure relates to a tower-shaped support device comprising: a plurality of main frames arranged in a vertical direction on a mounting surface; a plurality of support frames which are coupled to the main frames in a direction that is vertical with respect to the main frame while the pair of frames facing each other are arranged at the same height, and which support at least one current limiting resistance unit module for limiting the fault current of a power system; and a lower frame and an upper frame respectively provided at the upper and lower sides of the main frame and grounded.

19 Claims, 11 Drawing Sheets

(56) References Cited

U.S. PATENT DOCUMENTS

| | | | | | |
|---|---|---|---|---|---|
| 3,887,252 | A | * | 6/1975 | Fuller | A47B 63/067 116/202 |
| 4,847,585 | A | * | 7/1989 | Kiriloff | H01C 3/10 338/58 |
| 5,140,744 | A | * | 8/1992 | Miller | H01M 50/20 429/96 |
| 6,078,171 | A | * | 6/2000 | Kondoh | G01R 1/203 323/354 |
| 6,653,928 | B1 | * | 11/2003 | Kondo | G01R 1/203 338/319 |
| 7,535,126 | B2 | * | 5/2009 | Matsumoto | G01R 31/42 307/112 |
| 7,847,439 | B2 | * | 12/2010 | Matsumoto | G01R 31/42 307/112 |
| 7,884,505 | B2 | * | 2/2011 | Matsumoto | G01R 1/203 307/112 |
| 8,149,577 | B2 | * | 4/2012 | Tang | H01L 23/34 361/717 |
| 10,840,569 | B2 | * | 11/2020 | Hasegawa | H01M 10/6563 |
| 2005/0231868 | A1 | * | 10/2005 | Matsumoto | G01R 1/203 361/62 |
| 2009/0289656 | A1 | * | 11/2009 | Matsumoto | G01R 31/42 338/50 |
| 2010/0039212 | A1 | * | 2/2010 | Matsumoto | G01R 31/42 338/260 |
| 2011/0151311 | A1 | | 6/2011 | Lee et al. | |
| 2016/0219743 | A1 | | 7/2016 | Lindblom et al. | |
| 2017/0331166 | A1 | * | 11/2017 | Hasegawa | H01G 11/10 |
| 2018/0375424 | A1 | * | 12/2018 | Kim | H02B 5/01 |

FOREIGN PATENT DOCUMENTS

| | | | |
|---|---|---|---|
| CN | 102479589 | A | 5/2012 |
| CN | 204360867 | U | 5/2015 |
| CN | 206059058 | U | 3/2017 |
| CN | 206353466 | U | 7/2017 |
| CN | 107103972 | A | 8/2017 |
| CN | 107180692 | A | 9/2017 |
| KR | 2009-0123072 | A | 12/2009 |
| KR | 10-1266629 | B1 | 5/2013 |
| KR | 2017-0070599 | A2 | 6/2017 |
| KR | 10-1799537 | B1 | 11/2017 |
| KR | 20210147175 | A * | 12/2021 |
| WO | 2013094797 | A1 | 6/2013 |
| WO | 2017104921 | A1 | 6/2017 |

OTHER PUBLICATIONS

Chinese Office Action for related Chinese Application No. 2021102702226830; dated Nov. 1, 2021; (9 pages).

Japanese Office Action for related Japanese Application No. 2021-507791; dated Dec. 17, 2021; (7 pages).

English Translation of the International Search Report; ISR dated Nov. 26, 2019 in related PCT/KR2019/010295.

Japanese Office Action for related Japanese Application No. 2021-507791; dated Jun. 28, 2022; (6 pages).

Chinese Notice of Allowance for related Chinese Application No. 201980053204.2; dated May 24, 2022; (7 pages).

Notice of Allowance for related Japanese Application No. 2021-507791; dated Jan. 24, 2023; (3 pages).

* cited by examiner

[FIG. 1]
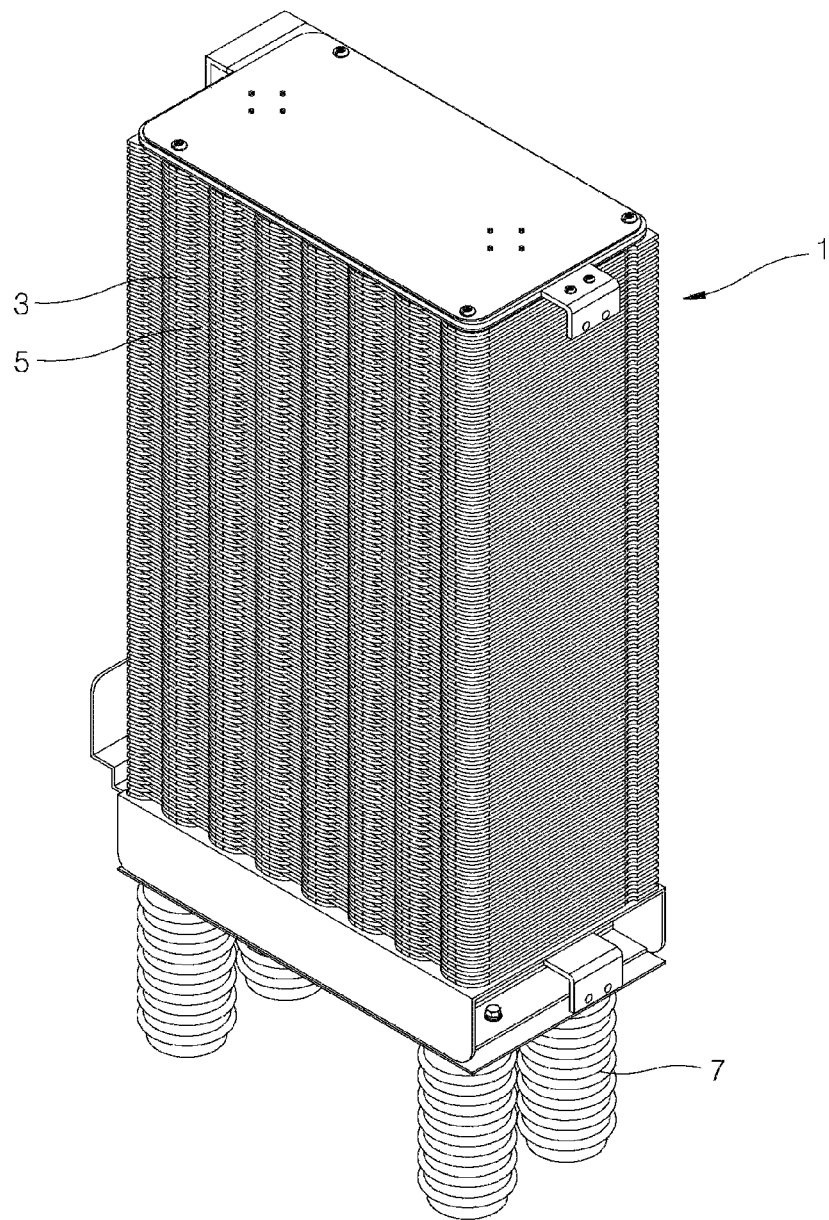

【FIG. 2】
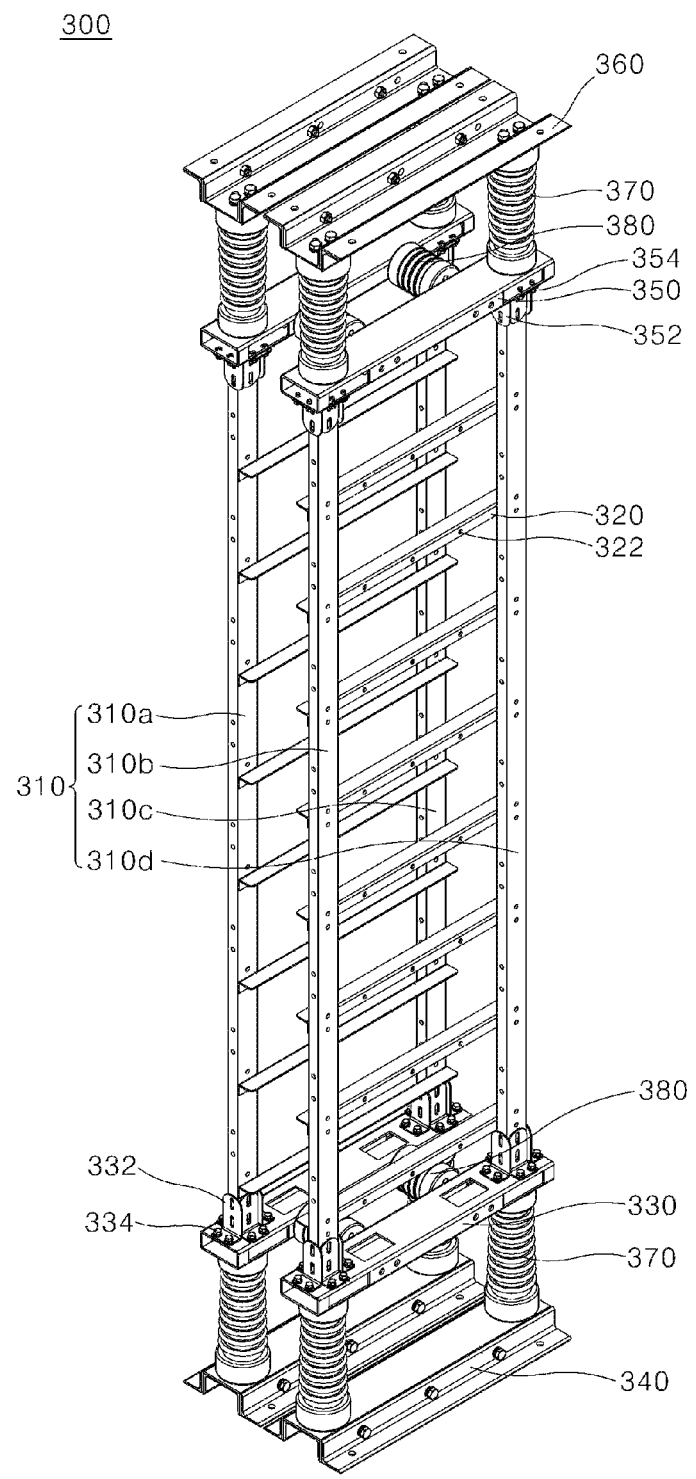

[FIG. 3]
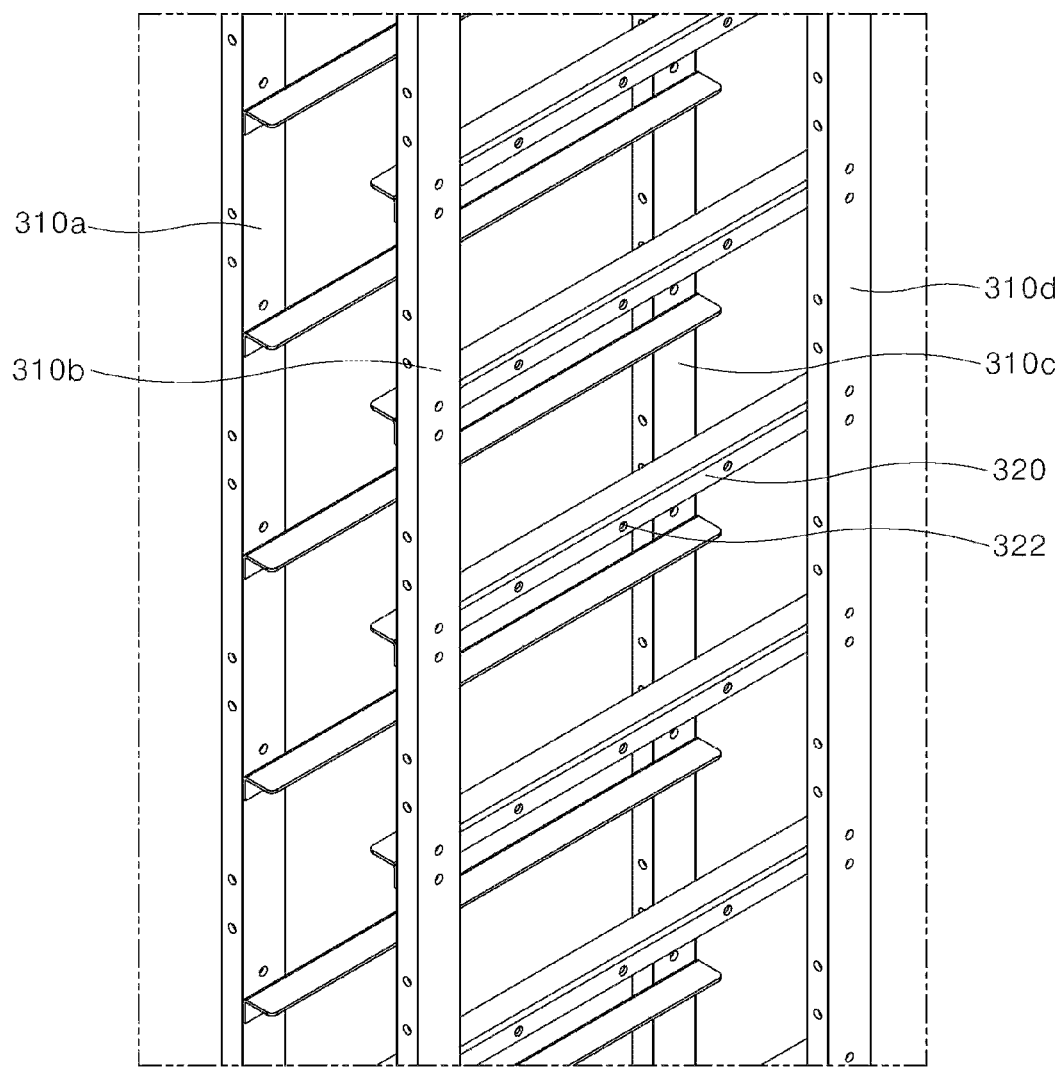

【FIG. 4】
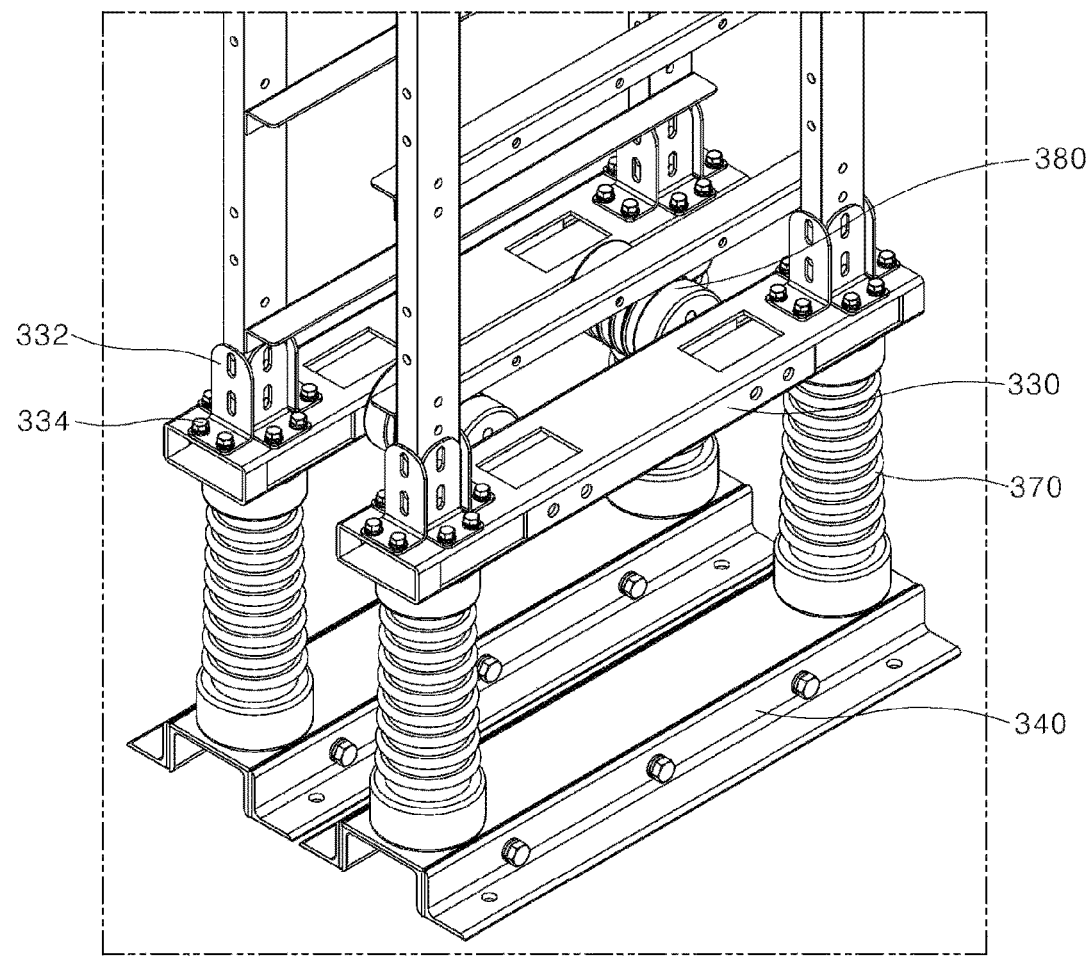

[FIG. 5]
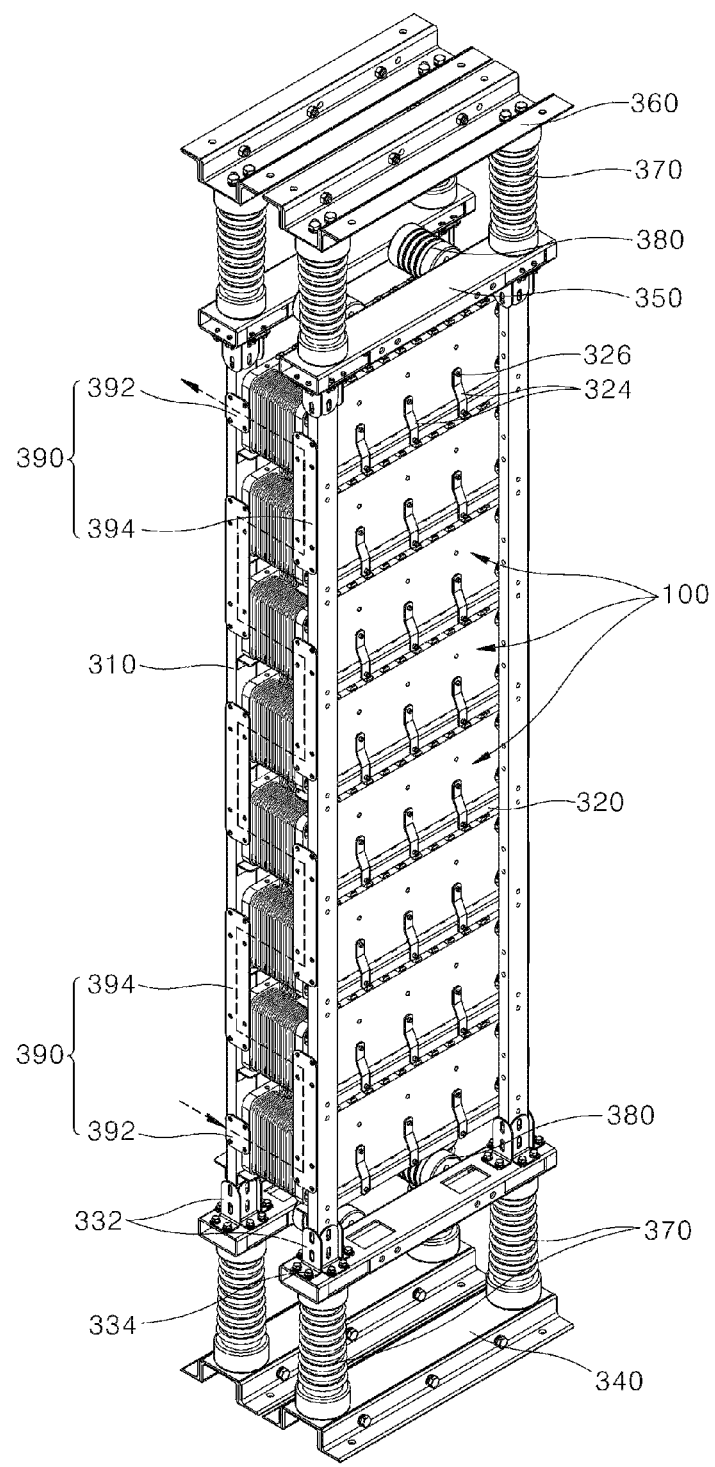

[FIG. 6]
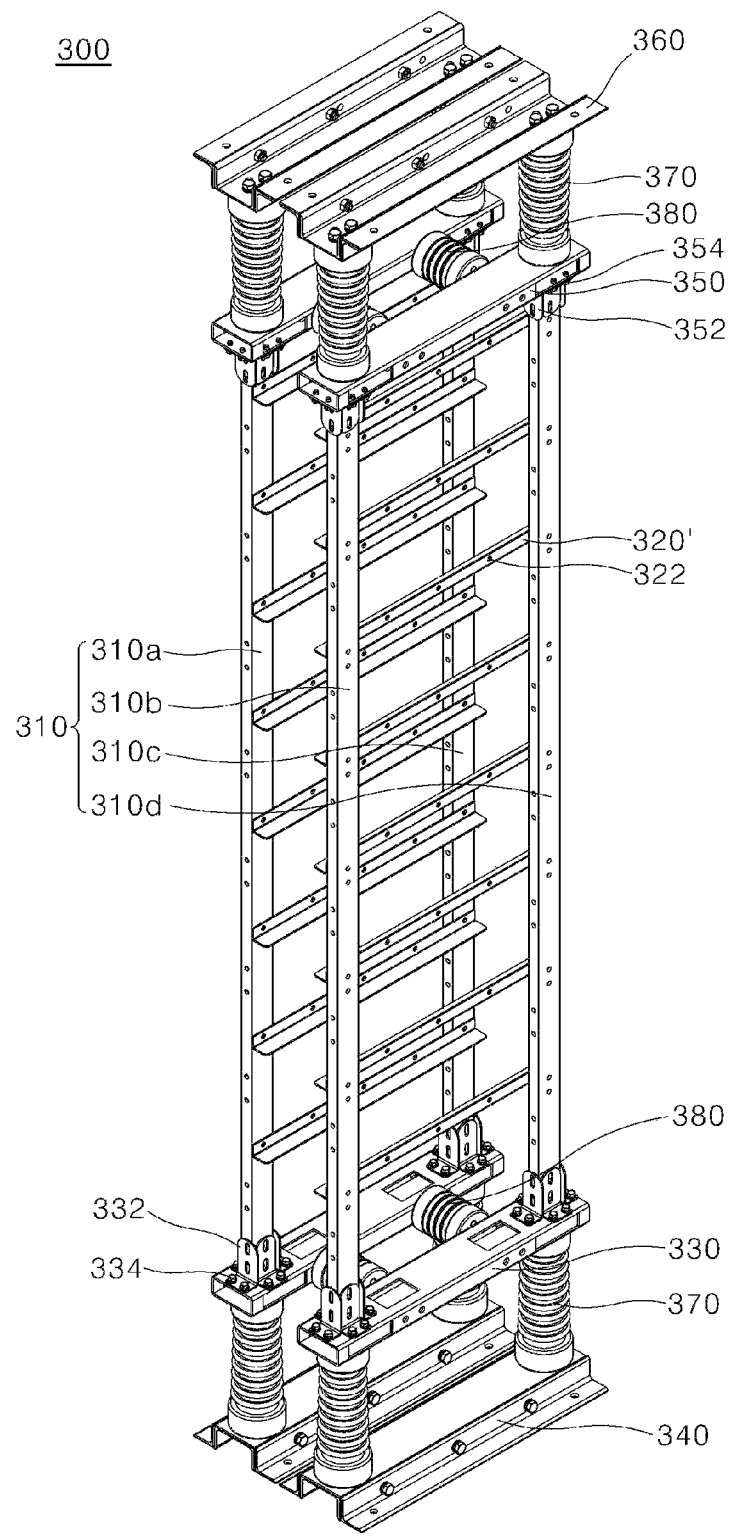

[FIG. 7]
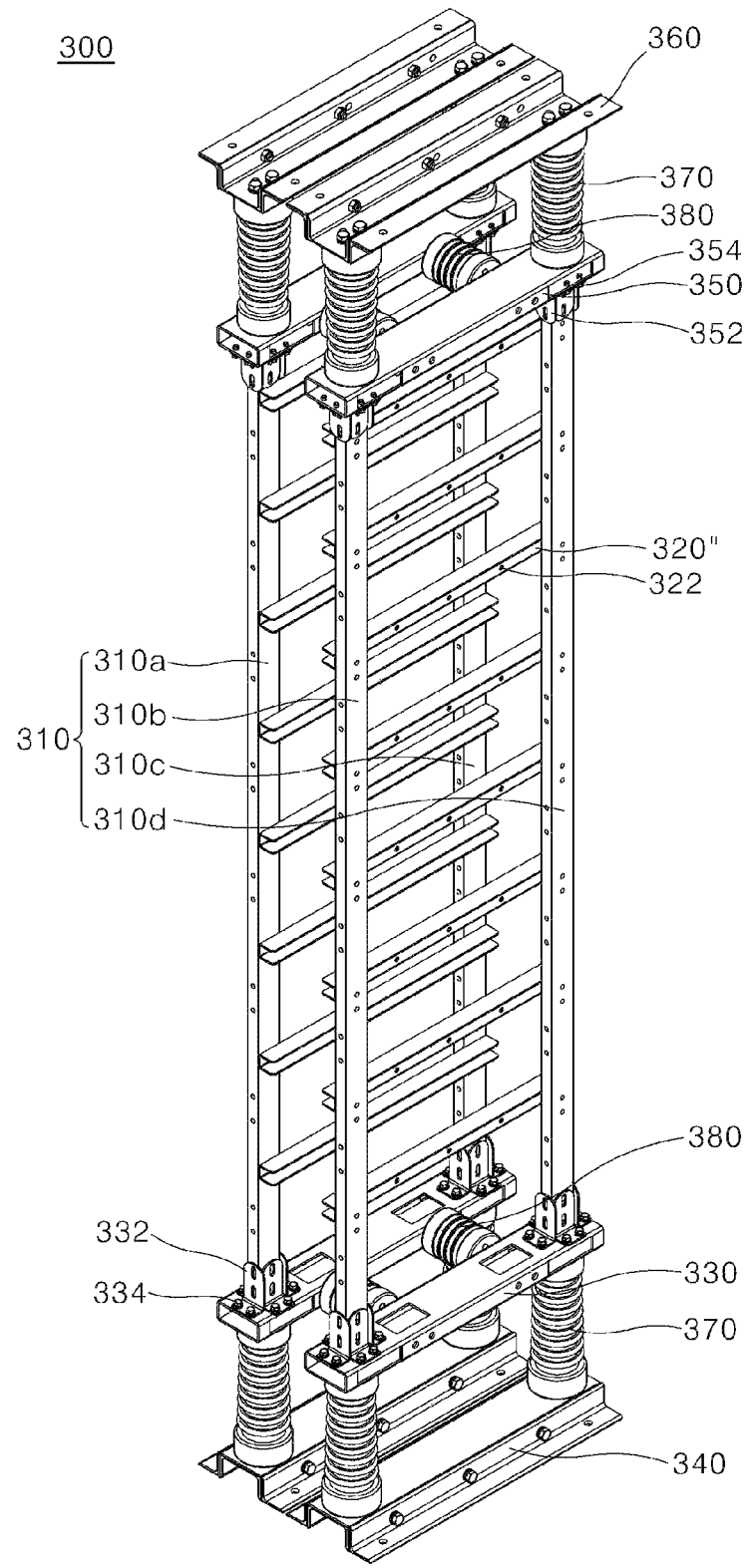

[FIG. 8]
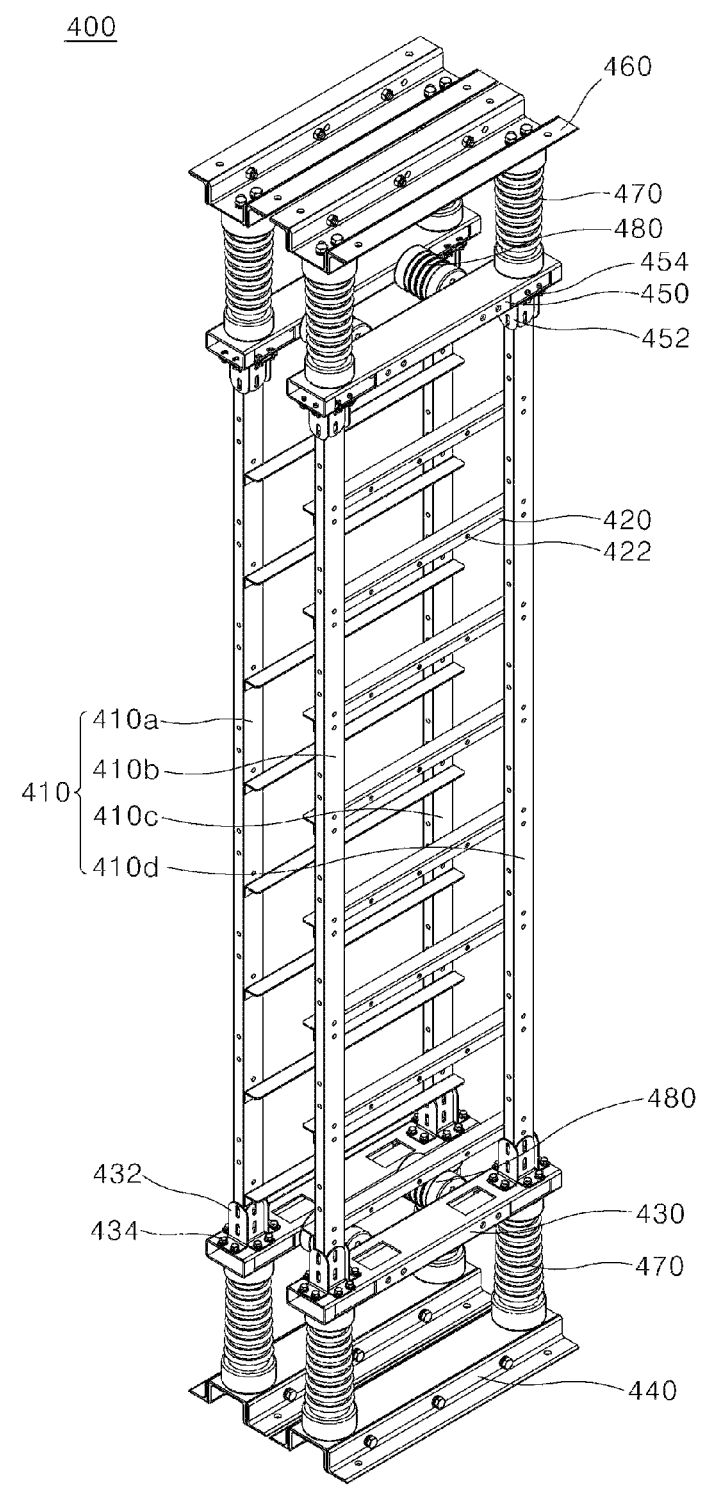

[FIG. 9]
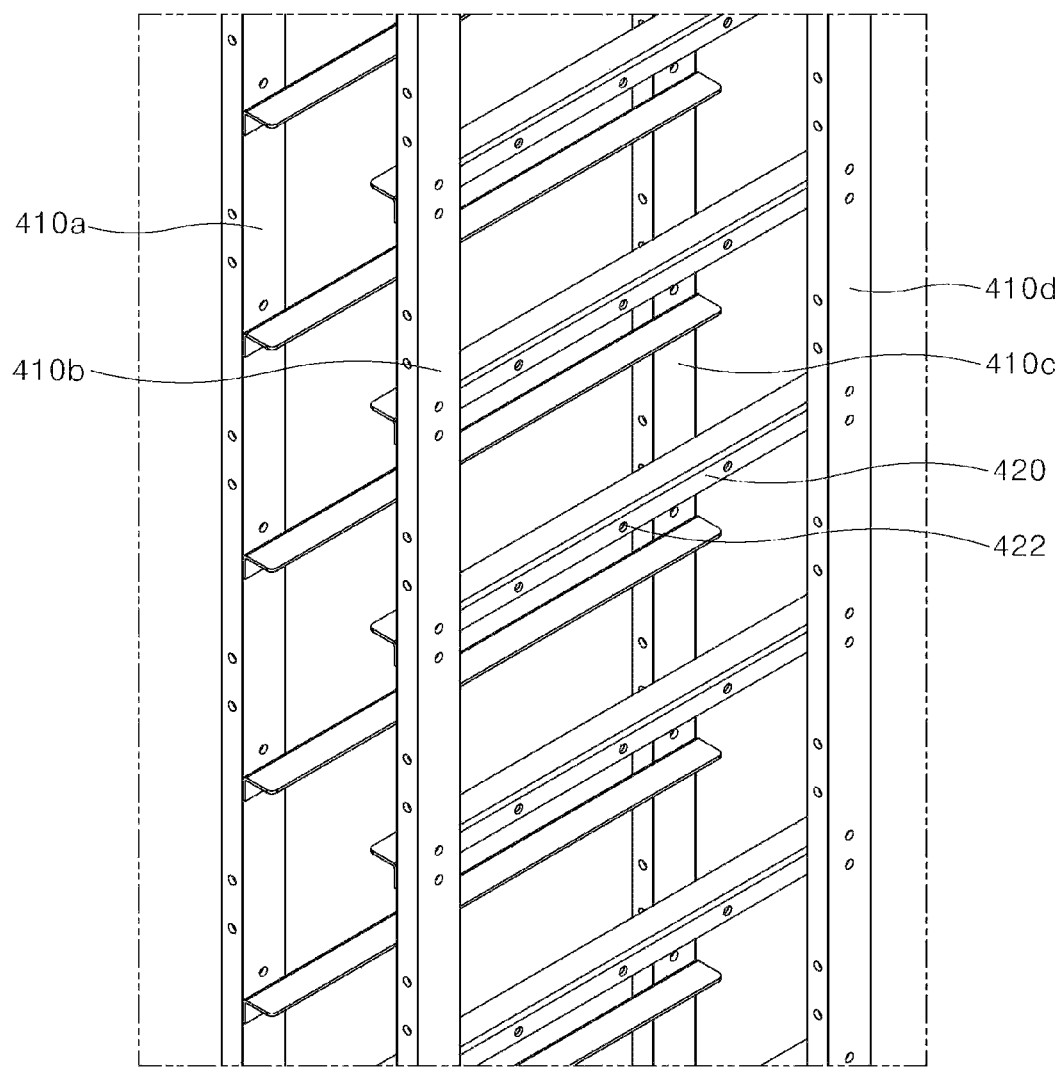

[FIG. 10]
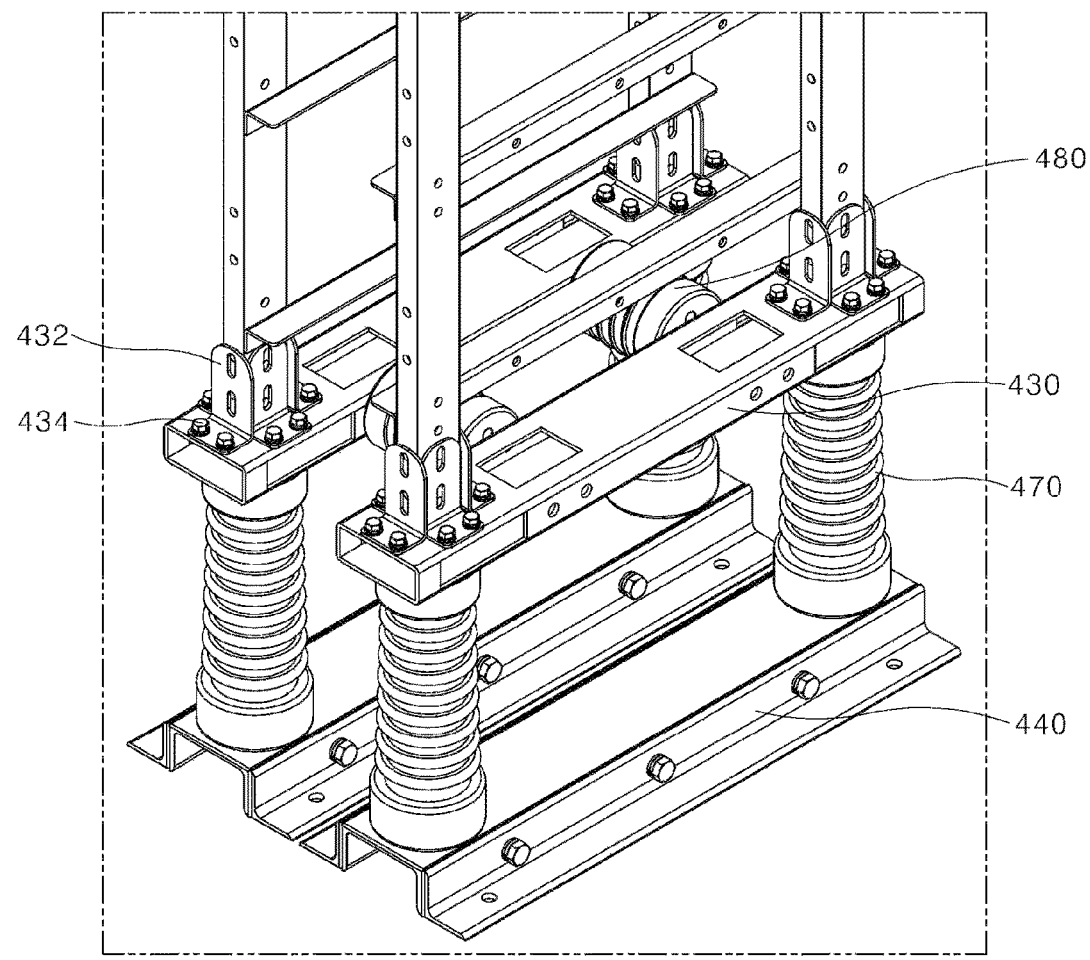

[FIG. 11]
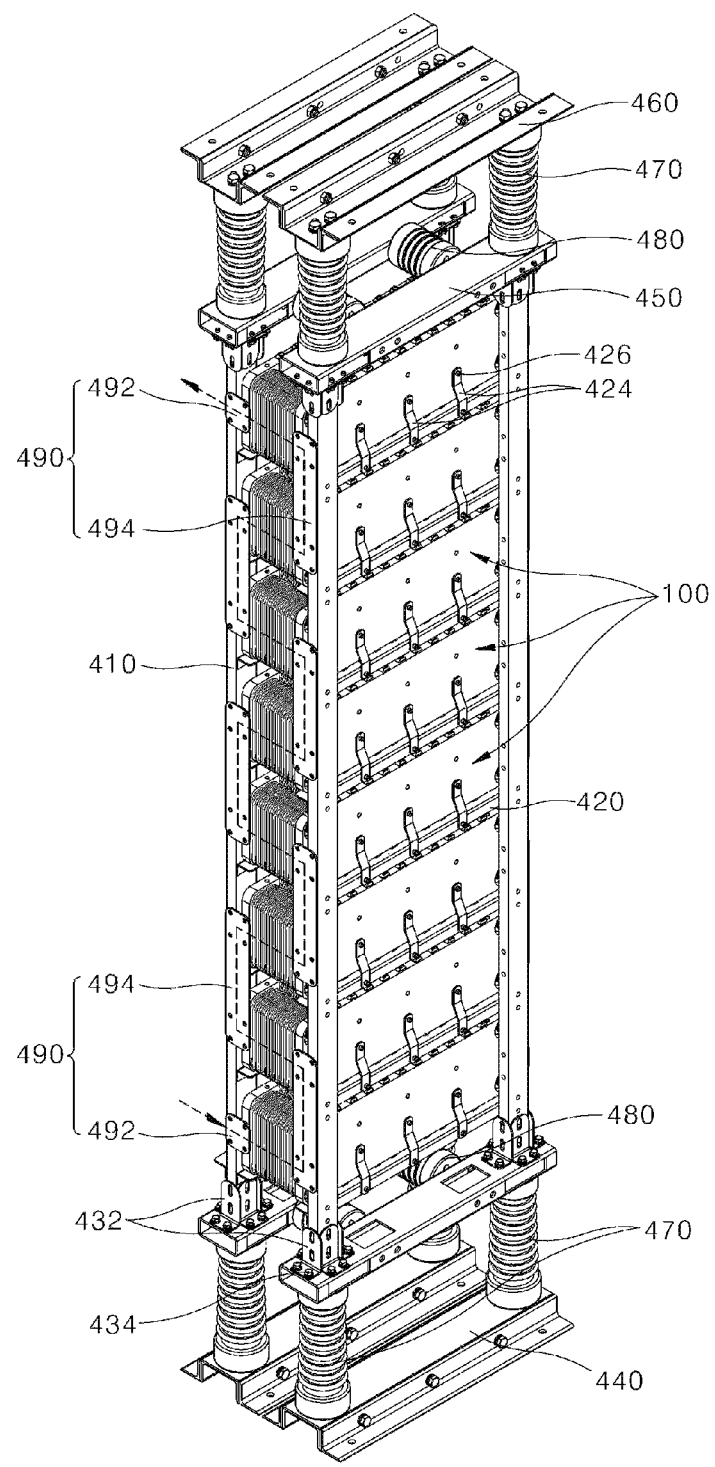

TOWER-SHAPED SUPPORT DEVICE

CROSS-REFERENCE TO RELATED APPLICATIONS

This application is the National Stage filing under 35 U.S.C. 371 of International Application No. PCT/KR2019/010295, filed on Aug. 13, 2019, which claims the benefit of earlier filing date and right of priority to Korean Application No. 10-2018-0096082, filed on Aug. 17, 2018 and Korean Application No. 10-2018-0096084, filed on Aug. 17, 2018, the contents of which are all hereby incorporated by reference herein in their entirety.

FIELD

The present disclosure relates to a tower-shaped support apparatus having an insulating structure and supporting a plurality of modular current-limiting resistors.

BACKGROUND

In general, a current-limiting resistor (CLR) functions to limit a fault current. The current-limiting resistor is applied to a power system to limit the fault current that occurs in the power system. When the current-limiting resistor is used, damage to a power device or power failure may be prevented even when the fault current occurs.

Since a required resistance magnitude varies depending on a power system to which the CLR is applied, a design of the current-limiting resistor varies according to the resistance magnitude. Hereinafter, a conventional current-limiting resistor will be described with reference to the drawings.

FIG. 1 is a perspective view showing a conventional current-limiting resistor.

As shown in FIG. 1, a conventional current-limiting resistor 1 has a structure in which plate resistor pieces 3 are stacked vertically and welded with each other such that the number of the stacked plate resistor pieces 3 is based on the resistance magnitude required for the power system to which the CLR is applied. The plate resistor pieces 3 are stacked in a meandering meander structure such that a constant spacing is maintained between neighboring plate resistor pieces 3. The plurality of plate resistor pieces 3 are welded with each other via contact point welding. An insulating member 5 is inserted between the plate resistor pieces 3.

The current-limiting resistor 1 as described above is constructed so that the resistor pieces 3 are stacked, and fixed and then an insulator 7 is coupled thereto. Then, the current-limiting resistor 1 is mounted directly to a switchboard without a separate supporting structure or storage structure. The insulator 7 is provided to minimize deformation of the current-limiting resistor due to attraction and repulsion between the resistor pieces that occur when limiting the fault current.

In the current-limiting resistor 1 according to the prior art, the resistor pieces 3 are welded with each other such that the number of the pieces 3 is based on required resistance magnitude. Thus, when the required resistance magnitude is large, a size of the current-limiting resistor 1 is also increased.

However, the current-limiting resistor 1 only having the insulator 7 is mounted on the switchboard while not using a separate structure to support the current-limiting resistor 1. Thus, the current-limiting resistor 1 is affected by an external environment. The conventional current-limiting resistor 1 has no protection and support structure, so that there is a risk of failure of or damage to the current-limiting resistor 1.

Further, when the size of the current-limiting resistor 1 increases, it is difficult for an operator to move the current-limiting resistor 1. Accordingly, the current-limiting resistor 1 according to the prior art may be damaged during transfer thereof. When moving or installing the current-limiting resistor 1, there may be risk of injury to the operator.

SUMMARY

A purpose of the present disclosure is to provide a tower-shaped support apparatus in which a current-limiting resistor is easily mounted.

A purpose of the present disclosure is to provide a tower-shaped support apparatus having excellent cooling performance to cool down a current-limiting resistor.

The purposes of the present disclosure are not limited to the above-mentioned purposes. Other purposes and advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

A first aspect of the present disclosure provides a tower-shaped support apparatus comprising: a plurality of main frames, each extending in a vertical direction upwardly of an installation face; a plurality of support frames arranged vertically, each support frame extending in a horizontal direction and coupled to the main frames, wherein a pair of opposing support frames are spaced from each other and are disposed at the same vertical level, and support a corresponding current-limiting resistor unit module limiting a fault current of a power system; and lower frames and upper frames respectively installed on tops and bottoms of the main frames, and grounded.

In one implementation of the first aspect, the pair of opposing support frames support a bottom of corresponding the current-limiting resistor unit module.

In one implementation of the first aspect, the support frame is made of a conductive material.

In one implementation of the first aspect, the apparatus further comprises a plurality of module coupling links, wherein each link has one end coupled to the support frame using a bolt, and the other end coupled to a corresponding current-limiting resistor unit module using a bolt such that the support frame and the corresponding current-limiting resistor unit module are coupled to each other via each link, wherein each link has a bar shape and is made of a conductive material.

In one implementation of the first aspect, the apparatus further comprises: a plurality of first insulating members respectively installed between the main frames and the lower frames and between the main frames and the upper frames to insulate the main frames and the lower frames from each other and insulate the main frames and the upper frames from each other; and a plurality of busbars installed on the main frames to electrically connect the power system and the current-limiting resistor unit modules to each other.

In one implementation of the first aspect, the busbar has one end coupled to the main frame and the other end coupled to the current-limiting resistor unit module.

In one implementation of the first aspect, the busbars are arranged on the main frames in a zig-zag manner to allow the plurality of the current-limiting resistor unit modules to be sequentially and electrically conductive.

When a fault current occurs in the power system, the fault current flows through the busbar to the current-limiting resistor unit module which may limit the fault current.

In one implementation of the first aspect, the main frame is made of an insulating material.

In one implementation of the first aspect, the apparatus further comprises a plurality of upper base frames disposed between and coupled to the first insulating members and the main frames to support the main frames.

In one implementation of the first aspect, the apparatus further comprises a plurality of second insulating members installed at the upper base frames, and extending between opposing upper base frames to insulate the opposing upper base frames from each other.

In one implementation of the first aspect, the apparatus further comprises a stopper frame horizontally extending between opposing main frames, and positioned at a position opposite to a position from which the current-limiting resistor unit module is inserted, wherein the stopper frame limits horizontal movement of the current-limiting resistor unit module.

In one implementation of the first aspect, the support frame extends in a direction perpendicular to a direction in which plate resistors of the current-limiting resistor unit module are stacked, and supports the current-limiting resistor unit module.

A second aspect of the present disclosure provides a tower-shaped support apparatus comprising: a plurality of main frames, each extending in a vertical direction upwardly of an installation face; a plurality of support frames arranged vertically, each support frame extending in a horizontal direction and coupled to the main frames, wherein a pair of opposing support frames are spaced from each other and are disposed at the same vertical level, and support a corresponding current-limiting resistor unit module limiting a fault current of a power system; lower frames and upper frames respectively installed on tops and bottoms of the main frames, and grounded; a plurality of first insulating members respectively installed between the main frames and the lower frames and between the main frames and the upper frames to insulate the main frames and the lower frames from each other and insulate the main frames and the upper frames from each other; and a plurality of busbars installed on the main frames to electrically connect the power system and the current-limiting resistor unit modules to each other.

In one implementation of the second aspect, the apparatus further comprises a plurality of module coupling links, wherein each link has one end coupled to the support frame using a bolt, and the other end coupled to a corresponding current-limiting resistor unit module using a bolt such that the support frame and the corresponding current-limiting resistor unit module are coupled to each other via each link, wherein each link has a bar shape and is made of a conductive material.

In one implementation of the second aspect, the busbar has one end coupled to the main frame and the other end coupled to the current-limiting resistor unit module.

In one implementation of the second aspect, the apparatus further comprises a plurality of upper base frames disposed between and coupled to the first insulating members and the main frames to support the main frames.

In one implementation of the second aspect, the apparatus further comprises a plurality of second insulating members installed at the upper base frames, and extending between opposing upper base frames to insulate the opposing upper base frames from each other.

According to the present disclosure, a single current-limiting resistor device may be constructed by inserting and fixing a plurality of current-limiting resistor unit modules one by one. Thus, the installation of the current-limiting resistor is easy and assembly thereof is improved. Further, workability and convenience when the operator installs the current-limiting resistor unit module are improved.

Further, the tower-shaped support apparatus according to the present disclosure accommodates and supports the current-limiting resistor unit modules in a direction perpendicular to a stacking direction of the current-limiting resistor unit modules. Thus, even when the plurality of unit modules are stacked, all thereof may be cooled using natural convection.

Further, the tower-shaped support apparatus according to the present disclosure has an insulating structure of the frame so that the external voltage is applied only to the current-limiting resistor in a state where the current-limiting resistor unit modules are inserted. Thus, the frame may be electrically and structurally stable, thereby minimizing deformation of the frame. Since the frame is electrically and structurally stable, the current-limiting resistor device may stably operate.

BRIEF DESCRIPTIONS OF DRAWINGS

FIG. 1 is a perspective view showing a conventional current-limiting resistor.

FIG. 2 is a perspective view showing a tower-shaped support apparatus according to an embodiment of the present disclosure.

FIG. 3 is a perspective view showing main components of the tower-shaped support apparatus according to FIG. 2.

FIG. 4 is a perspective view showing a lower support structure of the tower-shaped support apparatus according to FIG. 2.

FIG. 5 is a perspective view showing a state in which a current-limiting resistor unit module is coupled to a tower-shaped support apparatus according to an embodiment of the present disclosure.

FIG. 6 and FIG. 7 are perspective views showing a tower-shaped support apparatus according to other embodiments of the present disclosure.

FIG. 8 is a perspective view showing a tower-shaped support apparatus according to another embodiment of the present disclosure.

FIG. 9 is a perspective view showing main components of the tower-shaped support apparatus according to FIG. 8.

FIG. 10 is a perspective view showing a lower support structure of the tower-shaped support apparatus according to FIG. 8.

FIG. 11 is a perspective view showing a state in which a current-limiting resistor unit module is coupled to a tower-shaped support apparatus according to another embodiment of the present disclosure.

DETAILED DESCRIPTION

The above purposes, features and advantages will be described later in detail with reference to the accompanying drawings. Accordingly, a person with ordinary knowledge in the technical field to which the present disclosure belongs may easily implement the technical idea of the present disclosure. In describing the present disclosure, when it is determined that detailed description of a known component related to the present disclosure may unnecessarily obscure gist of the present disclosure, the detailed description thereof is omitted. Hereinafter, a preferred embodiment according to the present disclosure will be described in detail with reference to the accompanying drawings. In the drawings, the same reference numerals are used to indicate the same or similar elements.

FIG. 2 is a perspective view showing a tower-shaped support apparatus according to an embodiment of the present disclosure. FIG. 3 is a perspective view showing main components of the tower-shaped support apparatus according to FIG. 2. FIG. 4 is a perspective view showing a lower support structure of the tower-shaped support apparatus according to FIG. 2. FIG. 5 is a perspective view showing a state in which a current-limiting resistor unit module is coupled to the tower-shaped support apparatus according to an embodiment of the present disclosure.

As shown in FIGS. 2 to 5, a tower-shaped support apparatus 300 according to an embodiment of the present disclosure houses a plurality of current-limiting resistor unit modules 100. The tower-shaped support apparatus 300 includes a plurality of main frames 310 constituting a basic framework, and a plurality of support frames 320 installed on the main frames 310 to support the current-limiting resistor unit modules 100 thereon. Further, the tower-shaped support apparatus 300 further includes a lower base frame 330 supporting the main frames 310 and the support frames 320, and a lower frame 340 fixed to an installation face. The tower-shaped support apparatus 300 further includes an upper base frame 350 that supports the main frame 310 and the support frame 320, and an upper frame 360 that fixes the upper base frame 350. First insulating members 370 for insulation may be respectively installed between the lower base frame 330 and the lower frame 340 and between the upper base frame 350 and the upper frame 360. Second insulating members 380 for additional insulation may be respectively on the lower base frame 330 and the upper base frame 350. While the current-limiting resistor unit modules 100 are installed in the tower-shaped support apparatus 300, the current-limiting resistor unit modules 100 are electrically connected to a power system via a plurality of busbars 390.

As shown in FIG. 2 and FIG. 3, the main frames 310 constitutes the basic framework of the tower-shaped support apparatus 300. The main frames 310 may extend vertically from the installation face. The four main frames 310 may be arranged and spaced apart from each other to accommodate the hexahedral current-limiting resistor unit modules 100 (refer to FIG. 5). The main frames 310 may be made of an insulating material and thus may not be conductive with the current-limiting resistor unit module 100 installed thereon.

Further, the main frames 310 may be coupled to the support frames 320 using bolts, and support the current-limiting resistor unit modules 100. Therefore, the main frames 310 may be arranged to define a rectangular parallelepiped.

The main frames 310 include a first frame 310a and a second frame 310b. The second frame 310b is spaced apart from the first frame 310a by a predefined spacing. A third frame 310c and a fourth frame 310d are opposite to the first frame 310a and the second frame 310b, respectively. A spacing between the first frame 310a and the second frame 310b is the same as that between the third frame 310c and the fourth frame 310d. A spacing between the first frame 310a and the third frame 310c is greater than that between the first frame 310a and the second frame 310b. Similarly, a spacing between the second frame 310b and the fourth frame 310d is greater than that between the first frame 310a and the second frame 310b. A spacing between the first frame 310a to the fourth frame 310d may be set in consideration of a size of the current-limiting resistor unit module 100. The support frames 320 may be coupled to the first frame 310a to the fourth frame 310d.

The support frames 320 extends horizontally, that is, in a parallel manner to the installation face, that is, in a perpendicular manner to the main frames 310. Since the current-limiting resistor unit modules 100 are stacked in the length direction of the main frames 310, an extension direction of the support frames 320 is perpendicular to a direction in which plate resistors 130 of the current-limiting resistor unit module 100 are stacked. The support frames 320 include a plurality of support frames. A pair of the support frames 320 are mounted at the same vertical level. The support frame 320 may be made of a conductive material so that the current-limiting resistor unit module 100 and the support frame 310 coupled to the current-limiting resistor unit module 100 have a common mode voltage. In this connection, the common mode voltage may refer to a phenomenon in which a voltage applied to the unit module and a voltage applied to the support frame are equal to each other. This will be described later.

As shown in FIG. 2 and FIG. 3, a first support frames 320 is coupled, at both ends thereof, to the first frame 310a and the third frame 310c, respectively. Further, a second support frame 320 is coupled, at both ends thereof, to the second frame 310b and the fourth frame 310d, respectively. The first support frame 320 coupled to the first frame 310a and the third frame 310c is disposed at the same vertical level as that of the second support frame 320 coupled to the second frame 310b and the fourth frame 310d. The pair of support frames 320 at the same vertical level support one current-limiting resistor unit module 100 thereon (See FIG. 5).

A face of the support frame 320 contacting a bottom of the current-limiting resistor unit module 100 faces upwardly of the tower-shaped support apparatus 300. A face that is bent vertically from the face facing upward is fixed to the main frame 310. Fixing of the support frame 320 to the main frame may be accomplished using bolts and nuts.

The current-limiting resistor unit module 100 has a structure in which a plurality of stacked resistors are supported, on both opposing sides thereof, by the frames, respectively. The current-limiting resistor unit module 100 may be pushed along a length direction of the frame and then mounted on the support frames 320. That is, when the operator puts the current-limiting resistor unit module 100 on the support frame 320 and presses and pushes the module 100, the current-limiting resistor unit module 100 may be seated on the support frames 320.

Although not shown in the drawing, a stopper frame or the like may be disposed to limit movement of the current-limiting resistor unit module 100 so that the current-limiting resistor unit module 100 does not deviate from the support frame 320. The stopper frame may extend between adjacent main frames 310 and in a perpendicular manner to the direction of movement of the current-limiting resistor unit module 100. That is, based on FIG. 3, the stopper frame may extend between the third frame 310c and the fourth frame 310d.

A direction in which the plate resistors of the current-limiting resistor unit module 100 are stacked is perpendicular to a length direction of the main frame. The support frames 320 may be arranged vertically and spaced from each other vertically and support the current-limiting resistor unit modules 100 arranged along a direction perpendicular to the stacking direction of the current-limiting resistor unit modules 100.

A plurality of bolt holes 322 are defined in the support frame 320 to fix the current-limiting resistor unit module 100 thereto. The bolt holes 322 are formed in a face of the support frame fixed to the main frame 310 and are formed to pass through the support frame and are arranged along the length direction of the support frame 320. A module coupling link 324 is fixed to the bolt hole 322 using a bolt 326 to fix the current-limiting resistor unit module 100 to the support frame. A conductive line is formed via a plurality of busbars 390 in a state in which the current-limiting resistor unit modules 100 are accommodated in the apparatus. The current-limiting resistor unit module 100 is conductive only via the busbar 390. This will be described later.

As shown in FIG. 5, the module coupling link 324 may be embodied as a bar made of a conductive material and having a predefined length. The module coupling link 324 has one end coupled to the support frame 320 and the other end coupled to a frame of the current-limiting resistor unit module 100. The module coupling link 324 is coupled to the support frame 320 and the current-limiting resistor unit module 100 using the bolts 326. The module coupling link 324 and the support frame 320 are made of the conductive material. Thus, when voltage is applied to the current-limiting resistor unit module 100, a common mode voltage is applied to the support frame 320 via the module coupling link 324.

After the main frames 310 and the support frame 320 having the above-described structures are coupled to each other, tops and bottoms thereof are fixed to the installation face via the support structure and the insulator.

As shown in FIG. 2 and FIG. 4, the lower base frames 330 are coupled to the bottoms of the main frames 310. The lower base frames 330 are supported on a plurality of first insulating members 370. The first insulating members 370 is supported on the lower frame 340 that is fixed to the installation face. A second insulating member 380 is installed between the lower base frames 330.

The lower base frames 330 are coupled to the bottoms of the main frames 310 to support the main frames 310. The lower base frame 330 has a predefined thickness and size. FIG. 4 shows an example in which the lower base frame has a hexahedral shape. The lower base frames 330 includes a pair of the lower base frames. The lower base frame 330 extends in a direction corresponding to the length direction of the support frame 320 to support a pair of main frames 310. Based on FIG. 4, one lower base frame 330 may support the first frame 310*a* and the third frame 310*c*, while the other lower base frame 330 may support the second frame 310*b* and the fourth frame 310*d*. The lower base frame 330 may be coupled to the main frame 310 using a connecting bracket 332 and a bolt 326.

The connecting bracket 332 is a L shaped bracket and is coupled to the main frame 310 via a plurality of bolts 334.

The lower base frame 330 may be made of a material having predefined rigidity to support the plurality of current-limiting resistor unit modules 100. For example, the lower base frame 330 may be made of SUS (stainless steel).

The first insulating member 370 is coupled to a bottom of the lower base frame 330.

The first insulating member 370 may act as an insulator and may include a plurality of the first insulating members to support the lower base frames 330. Four first insulating members 370 may be provided to support both ends of each of the two lower base frames 330. The first insulating member 370 has one end coupled to a bottom face of the lower base frame 330 and the other end coupled to a top face of the lower frame 340. The first insulating member 370 serves as an insulator between the lower base frame 330 and the lower frame 340.

The lower frame 340 supports the first insulating member 370 and is fixed to the installation face. The lower frames 340 should support a total weight of the tower-shaped support apparatus 300. Therefore, lower frame 340 may be made of a material with predefined thickness and rigidity. For example, the lower frame 340 may be made of steel.

Even when the lower frame 340 is made of a conductive material, the lower frame 340 is fixed to the installation face, and thus may be defined as 'ground'. Since the current tends to flow toward a portion having a smaller resistance, the current may flow toward the ground when the fault current flows into the current-limiting resistor unit module 100. To prevent this problem, the first insulating member 370 is installed.

In one example, a second insulating member 380 may be installed between the lower base frames 330. The second insulating member 380 is installed between the pair of lower base frames 330 to insulate the lower base frames 330 from each other.

The lower support structure having the above-described structure may be applied in the same manner to a top portion of the tower-shaped support apparatus 300 (Since the upper support structure has the same configuration and shape as those of the lower support structure, detailed description of the upper support structure will be omitted).

As shown in FIG. 2, a pair of upper base frames 350 is coupled to tops of the main frames 310. The upper base frame 350 is coupled to the main frame 310 by fastening a connecting bracket 352 using a bolt 354. A second insulating member 380 is installed between the upper base frames 350. Four second insulating members 380 are coupled to tops of the upper base frames 350. The upper frame 360 is coupled to the top of the first insulating member 370. The upper frame 360 may be fixed to a top of a switchboard or a top of an outer casing. The upper frame 360 also serves as the ground.

The tower-shaped support apparatus 300 having the above structure accommodates and supports the plurality of current-limiting resistor unit modules 100 to define a single conductive line. This will be described in detail with reference to FIG. 5 as follows.

The tower-shaped support apparatus 300 houses the current-limiting resistor unit modules 100 such that the number of the modules is based on a power system to which the modules are applied. For example, one current-limiting resistor unit module 100 may have a resistance magnitude of 1 ohm (a), and 8 ohms resistance of the current-limiting resistor is required for the power system. Thus, the tower-shaped support apparatus 300 may house 8 current-limiting resistor unit modules 100 to form the 8 ohm current-limiting resistor.

The current-limiting resistor unit module 100 includes a plurality of plate resistors, each extending in a meandering manner, and a pair of support frames for supporting the stacked resistors.

One plate resistor has a conductive line extending in a meandering manner. In one unit module 100, the plate resistors defines a single conductive line. The stacking direction of the resistors is horizontal in a parallel manner to the installation face where the tower-shaped support apparatus 300 is installed.

The plurality of current-limiting resistor unit modules 100 housed in the tower-shaped support apparatus 300 may be electrically connected to each other via the plurality of busbars 390, thereby to form a single conductive line.

A first busbar 392 may be installed at the lowest level of the first frame 310*a*. The first busbar 392 is connected to the power system so that when the fault current occurs, the fault current flows into the current-limiting resistor unit module 100. The fault current flows through the first busbar 392 to the current-limiting resistor unit module 100 located at the lowest level of the main frame 310. To this end, the first busbar 392 has one end fixed to the first frame 310*a* and the other end fixed to the frame 110 of the current-limiting resistor unit module 100. The fixing may be achieved using bolts. Since the frame 110 of the current-limiting resistor unit module 100 is made of a conductive material, the fault current may flow into the current-limiting resistor unit module 100.

The current flowing into a first and lowest current-limiting resistor unit module 100 flows along the resistors forming a single conductive line and flows along a second busbar 394 to a second current-limiting resistor unit module 100. To this end, it is desirable that the second busbar 394 has a length such that the lowest current-limiting resistor unit module 100 and the second current-limiting resistor unit module 100 may be connected to each other via the second busbar. Further, the second busbar 394 extends along a length direction of the second frame 310*b*.

As shown in FIG. 5, the second busbar 394 extends along the length direction of the first frame 310*a* and the second frame 310*b* and sequentially connects the plurality of current-limiting resistor unit modules 100 to each other in a zigzag manner. The highest current-limiting resistor unit module 100 may be connected to an outside of the limiting resistor via the first busbar 392 installed at a top level of the first frame 310*a*.

According to the above-described configuration, the current-limiting resistor unit modules 100 housed in the tower-shaped support apparatus 300 form a single conductive line (See an arrow in FIG. 5). Thus, the fault current may be limited in each of the current-limiting resistor unit modules 100 along the single conductive line.

In one example, when a fault current occurs in the power system, a high voltage is applied to the current-limiting resistor. Thus, the high voltage is applied to the current-limiting resistor unit module 100. Therefore, because the high voltage is applied to a portion above the lower base frame 330, the portion may be defined as a 'high voltage portion'. A portion below the lower base frame 330 may be insulated via the first insulating member 370 and the second insulating member 380 and may be grounded to the installation face.

Each support frame 320 is coupled to the main frame 310 as an insulator. However, the support frame 320 supports the current-limiting resistor unit module 100 while contacting the current-limiting resistor unit module 100 as the high voltage portion. Therefore, the support frame 320 may be in an intermediate voltage state (floating state) other than the ground state or the high voltage state. This induced voltage is not good in terms of insulation performance. Therefore, when coupling the support frame 320 to the current-limiting resistor unit module 100 via the conductive material based module coupling link 324, the support frame 320 and the current-limiting resistor unit module 100 have the common mode voltage. This is because it is easier and structurally simpler to allow the support frame 320 and the current-limiting resistor unit module 100 to have the common mode voltage than to ground the support frame 320.

In the tower-shaped support apparatus 300 according to the present disclosure having the above-described configuration, the current-limiting resistor device may be configured based on a required resistance magnitude by varying the number of current-limiting resistor unit modules 100 to be accommodated in the apparatus 300. When configuring the current-limiting resistor unit modules 100 while considering that the required resistance varies depending on the power system to which the current-limiting resistor unit modules 100 are applied, the modular current-limiting resistor device may be easily configured.

As described above, the current-limiting resistor unit module 100 may be constructed such that the resistance thereof is 1 ohm (a). Therefore, as shown in FIG. 5, the modular current-limiting resistor device may be constructed using 8 unit modules 100.

When, as shown in FIG. 5, the modular current-limiting resistor device is constructed using the 8 unit modules 100, and when the modular current-limiting resistor device is activated, a temperature of each unit module 100 rises. When the temperature of the unit module 100 rises and the surrounding air is heated, the heated air ascends.

Accordingly, air flows from a bottom to a top of the tower-shaped support apparatus 300 may occur. Natural convection occurs as cold air from a bottom of the tower-shaped support apparatus 300 is introduced into the modules 100. Each unit module 100 is cooled down as air flows from a bottom of the frame of the module to a top thereof via the natural convection.

Each unit module 100 is constructed such that a plate face of the plate resistor 110 is oriented in a vertical direction in which the natural convection occurs. In other words, the stacking direction of the plate resistors 110 is perpendicular to the vertical direction in the natural convection occurs. Further, in each unit module 100, a spacing may be defined between the stacked plate resistors 110. Therefore, the air rising up due to the natural convection easily passes through the spacing between the plate resistors 110, so that the cooling effect is increased, compared to the conventional current-limiting resistor 1 according to FIG. 1.

The tower-shaped support apparatus according to an embodiment of the present disclosure as described above has the support frame bent downwards. However, the shape of the support frame may be modified in various forms (Detailed descriptions of the same components as those of the above-described embodiment will be omitted).

FIG. 6 and FIG. 7 are perspective views showing tower-shaped support apparatuses according to other embodiments of the present disclosure, respectively.

As shown in FIG. 6, in the tower-shaped support apparatus 300 according to another embodiment of the present disclosure, the support frame 320' may have a 'L' shaped cross-section. That is, the support frame 320' is bent horizontally from a vertical face thereof that is coupled to the main frame 310. The horizontal faces of the support frames 320' may be spaced from each other. The current-limiting resistor unit module 100 may be supported on the horizontal faces.

Alternatively, as shown in FIG. 7, in the tower-shaped support apparatus 300 according to another embodiment of the present disclosure, the support frame 320" may have a cross section in a shape of a 90 degrees-rotated 'U'. When the support frame 320" has the 90 degrees-rotated 'U' shaped cross section, rollers or projections may be disposed on the fames supporting the stack of the current-limiting resistor unit module 100 such that a stack of the resistors and the fames supporting the stack of the current-limiting resistor unit module 100 are smoothly inserted into the support frame 320".

Alternatively, although not shown in the drawing, the support frame has a L-shaped cross section. A roller or the like may be disposed on the current-limiting resistor unit module.

As long as the current-limiting resistor unit module may be seated on the support frame in a sliding manner, the support frame may have an structure.

FIG. 8 is a perspective view showing a tower-shaped support apparatus according to another embodiment of the present disclosure. FIG. 9 is a perspective view showing main components of the tower-shaped support apparatus according to FIG. 8. FIG. 10 is a perspective view showing a lower support structure of the tower-shaped support apparatus according to FIG. 8. FIG. 11 is a perspective view showing a state in which a current-limiting resistor unit module is coupled to a tower-shaped support apparatus according to another embodiment of the present disclosure.

As shown in FIGS. 8 to 11, a tower-shaped support apparatus 400 according to an embodiment of the present disclosure houses a plurality of current-limiting resistor unit modules 100. The tower-shaped support apparatus 400 includes a plurality of main frames 410 constituting a basic framework, and a plurality of support frames 420 installed on the main frames 410 to support the current-limiting resistor unit modules 100 thereon. Further, the tower-shaped support apparatus 400 further includes a lower base frame 430 supporting the main frames 410 and the support frames 420, and a lower frame 440 fixed to an installation face. The tower-shaped support apparatus 400 further includes an upper base frame 450 that supports the main frame 410 and the support frame 420, and an upper frame 460 that fixes the upper base frame 450. First insulating members 470 for insulation may be respectively installed between the lower base frame 430 and the lower frame 440 and between the upper base frame 450 and the upper frame 460. Second insulating members 480 for additional insulation may be respectively on the lower base frame 430 and the upper base frame 450. While the current-limiting resistor unit modules 100 are installed in the tower-shaped support apparatus 400, the current-limiting resistor unit modules 100 are electrically connected to a power system via a plurality of busbars 490.

As shown in FIG. 8 and FIG. 9, the main frames 410 constitutes the basic framework of the tower-shaped support apparatus 400. The main frames 410 may extend vertically from the installation face. The four main frames 410 may be arranged and spaced apart from each other to accommodate the hexahedral current-limiting resistor unit modules 100. The main frames 410 may be made of an insulating material and thus may not be conductive with the current-limiting resistor unit module 100 installed thereon.

Further, the main frames 410 may be coupled to the support frames 420 using bolts, and support the current-limiting resistor unit modules 100. Therefore, the main frames 410 may be arranged to define a rectangular parallelepiped.

The main frames 410 include a first frame 410a and a second frame 410b. The second frame 410b is spaced apart from the first frame 410a by a predefined spacing. A third frame 410c and a fourth frame 410d are opposite to the first frame 410a and the second frame 410b, respectively. A spacing between the first frame 410a and the second frame 410b is the same as that between the third frame 410c and the fourth frame 410d. A spacing between the first frame 410a and the third frame 410c is greater than that between the first frame 410a and the second frame 410b. Similarly, a spacing between the second frame 410b and the fourth frame 410d is greater than that between the first frame 410a and the second frame 410b. A spacing between the first frame 410a to the fourth frame 410d may be set in consideration of a size of the current-limiting resistor unit module 100. The support frames 420 may be coupled to the first frame 410a to the fourth frame 410d.

The support frames 420 extends horizontally, that is, in a parallel manner to the installation face, that is, in a perpendicular manner to the main frames 410. Since the current-limiting resistor unit modules 100 are stacked in the length direction of the main frames 410, an extension direction of the support frames 420 is perpendicular to a direction in which plate resistors 130 of the current-limiting resistor unit module 100 are stacked. The support frames 420 include a plurality of support frames. A pair of the support frames 420 are mounted at the same vertical level. The support frame 420 may be made of a conductive material so that the current-limiting resistor unit module 100 and the support frame 410 coupled to the current-limiting resistor unit module 100 have a common mode voltage. In this connection, the common mode voltage may refer to a phenomenon in which a voltage applied to the unit module and a voltage applied to the support frame are equal to each other. This will be described later.

As shown in FIG. 8 and FIG. 9, a first support frames 420 is coupled, at both ends thereof, to the first frame 410a and the third frame 410c, respectively. Further, a second support frame 420 is coupled, at both ends thereof, to the second frame 410b and the fourth frame 410d, respectively. The first support frame 420 coupled to the first frame 410a and the third frame 410c is disposed at the same vertical level as that of the second support frame 420 coupled to the second frame 410b and the fourth frame 410d. The pair of support frames 420 at the same vertical level support one current-limiting resistor unit module 100 thereon (See FIG. 5).

A horizontal face of the support frame 420 contacting a bottom of the current-limiting resistor unit module 100 faces upwardly of the tower-shaped support apparatus 400. A vertical face that is bent vertically and downwardly from the face facing upward is fixed to the main frame 410. Fixing of the support frame 420 to the main frame may be accomplished using bolts and nuts.

The current-limiting resistor unit module 100 has a structure in which a plurality of stacked resistors are supported, on both opposing sides thereof, by the frames, respectively. The current-limiting resistor unit module 100 may be pushed along a length direction of the frame and then mounted on the support frames 420. That is, when the operator puts the current-limiting resistor unit module 100 on the support frame 420 and presses and pushes the module 100, the current-limiting resistor unit module 100 may be seated on the support frames 420.

Although not shown in the drawing, a stopper frame or the like may be disposed to limit movement of the current-limiting resistor unit module 100 so that the current-limiting resistor unit module 100 does not deviate from the support frame 420. The stopper frame may extend between adjacent main frames 410 and in a perpendicular manner to the direction of movement of the current-limiting resistor unit module 100. That is, based on FIG. 9, the stopper frame may extend between the third frame 410c and the fourth frame 410d.

A direction in which the plate resistors of the current-limiting resistor unit module 100 are stacked is perpendicular to a length direction of the main frame. The support frames 420 may be arranged vertically and spaced from each other vertically and support the current-limiting resistor unit modules 100 arranged along a direction perpendicular to the stacking direction of the current-limiting resistor unit modules 100.

A plurality of bolt holes 422 are defined in the support frame 420 to fix the current-limiting resistor unit module 100 thereto. The bolt holes 422 are formed in a face of the support frame fixed to the main frame 410 and are formed to pass through the support frame and are arranged along the length direction of the support frame 420. A module coupling link 424 is fixed to the bolt hole 422 using a bolt 426 to fix the current-limiting resistor unit module 100 to the support frame. A conductive line is formed via a plurality of busbars 490 in a state in which the current-limiting resistor unit modules 100 are accommodated in the apparatus. The current-limiting resistor unit module 100 is conductive only via the busbar 490. This will be described later.

As shown in FIG. 11, the module coupling link 424 may be embodied as a bar made of a conductive material and having a predefined length. The module coupling link 424 has one end coupled to the support frame 420 and the other end coupled to a frame of the current-limiting resistor unit module 100. The module coupling link 424 is coupled to the support frame 420 and the current-limiting resistor unit module 100 using the bolts 426. The module coupling link 424 and the support frame 420 are made of the conductive material. Thus, when voltage is applied to the current-limiting resistor unit module 100, a common mode voltage is applied to the support frame 420 via the module coupling link 424.

After the main frames 410 and the support frame 420 having the above-described structures are coupled to each other, tops and bottoms thereof are fixed to the installation face via the support structure and the insulator.

As shown in FIG. 8 and FIG. 9, the lower base frames 430 are coupled to the bottoms of the main frames 410. The lower base frames 430 are supported on a plurality of first insulating members 470. The first insulating members 470 is supported on the lower frame 440 that is fixed to the installation face. A second insulating member 480 is installed between the lower base frames 430.

The lower base frames 430 are coupled to the bottoms of the main frames 410 to support the main frames 410. The lower base frame 430 has a predefined thickness and size. FIG. 10 shows an example in which the lower base frame has a hexahedral shape. The lower base frames 430 includes a pair of the lower base frames. The lower base frame 430 extends in a direction corresponding to the length direction of the support frame 420 to support a pair of main frames 410. One lower base frame 430 may support the first frame 410a and the third frame 410c, while the other lower base frame 430 may support the second frame 410b and the fourth frame 410d. The lower base frame 430 may be coupled to the main frame 410 using a connecting bracket 432 and a bolt 426.

The connecting bracket 432 is a L shaped bracket and is coupled to the main frame 410 via a plurality of bolts 434.

The lower base frame 430 may be made of a material having predefined rigidity to support the plurality of current-limiting resistor unit modules 100. For example, the lower base frame 430 may be made of SUS (stainless steel).

The first insulating member 470 is coupled to a bottom of the lower base frame 430.

The first insulating member 470 may act as an insulator and may include a plurality of the first insulating members to support the lower base frames 430. Four first insulating members 470 may be provided to support both ends of each of the two lower base frames 430. The first insulating member 470 has one end coupled to a bottom face of the lower base frame 430 and the other end coupled to a top face of the lower frame 440. The first insulating member 470 serves as an insulator between the lower base frame 430 and the lower frame 440.

The lower frame 440 supports the first insulating member 470 and is fixed to the installation face. The lower frames 440 should support a total weight of the tower-shaped support apparatus 400. Therefore, lower frame 440 may be made of a material with predefined thickness and rigidity. For example, the lower frame 440 may be made of steel. Even when the lower frame 440 is made of a conductive material, the lower frame 440 is fixed to the installation face, and thus may be defined as 'ground'. Since the current tends to flow toward a portion having a smaller resistance, the current may flow toward the ground when the fault current flows into the current-limiting resistor unit module 100. To prevent this problem, the first insulating member 470 is installed.

In another example, a second insulating member 480 may be installed between the lower base frames 430. The second insulating member 480 is installed between the pair of lower base frames 430 to insulate the lower base frames 430 from each other.

The lower support structure having the above-described structure may be applied in the same manner to a top portion of the tower-shaped support apparatus 400 (Since the upper support structure has the same configuration and shape as those of the lower support structure, detailed description of the upper support structure will be omitted).

As shown in FIG. 8, a pair of upper base frames 450 is coupled to tops of the main frames 410. The upper base frame 450 is coupled to the main frame 410 by fastening a connecting bracket 452 using a bolt 454. A second insulating member 480 is installed between the upper base frames 450. Four second insulating members 480 are coupled to tops of the upper base frames 450. The upper frame 460 is coupled to the top of the first insulating member 470. The upper frame 460 may be fixed to a top of a switchboard or a top of an outer casing. The upper frame 460 also serves as the ground.

The tower-shaped support apparatus 400 having the above structure accommodates and supports the plurality of current-limiting resistor unit modules 100 to define a single conductive line. This will be described in detail with reference to FIG. 11 as follows.

The tower-shaped support apparatus 400 houses the current-limiting resistor unit modules 100 such that the number of the modules is based on a power system to which the modules are applied. For example, one current-limiting resistor unit module 100 may have a resistance magnitude of 1 ohm (a), and 8 ohms resistance of the current-limiting resistor is required for the power system. Thus, the tower-shaped support apparatus 400 may house 8 current-limiting resistor unit modules 100 to form the 8 ohm current-limiting resistor.

The current-limiting resistor unit module 100 includes a plurality of plate resistors, each extending in a meandering manner, and a pair of support frames for supporting the stacked resistors.

One plate resistor has a conductive line extending in a meandering manner. In one unit module 100, the plate resistors defines a single conductive line. The stacking direction of the resistors is horizontal in a parallel manner to the installation face where the tower-shaped support apparatus 400 is installed.

The plurality of current-limiting resistor unit modules 100 housed in the tower-shaped support apparatus 400 may be electrically connected to each other via the plurality of busbars 490, thereby to form a single conductive line.

A first busbar 492 may be installed at the lowest level of the first frame 410a. The first busbar 492 is connected to the power system so that when the fault current occurs, the fault current flows into the current-limiting resistor unit module 100. The fault current flows through the first busbar 492 to the current-limiting resistor unit module 100 located at the lowest level of the main frame 410. To this end, the first busbar 492 has one end fixed to the first frame 410a and the other end fixed to the frame 110 of the current-limiting resistor unit module 100. The fixing may be achieved using bolts. Since the frame 110 of the current-limiting resistor unit module 100 is made of a conductive material, the fault current may flow into the current-limiting resistor unit module 100.

The current flowing into a first and lowest current-limiting resistor unit module 100 flows along the resistors forming a single conductive line and flows along a second busbar 494 to a second current-limiting resistor unit module 100. To this end, it is desirable that the second busbar 494 has a length such that the lowest current-limiting resistor unit module 100 and the second current-limiting resistor unit module 100 may be connected to each other via the second busbar. Further, the second busbar 494 extends along a length direction of the second frame 410b.

As shown in FIG. 11, the second busbar 494 extends along the length direction of the first frame 410a and the second frame 410b and sequentially connects the plurality of current-limiting resistor unit modules 100 to each other in a zigzag manner. The highest current-limiting resistor unit module 100 may be connected to an outside of the limiting resistor via the first busbar 492 installed at a top level of the first frame 410a.

According to the above-described configuration, the current-limiting resistor unit modules 100 housed in the tower-shaped support apparatus 400 form a single conductive line (See an arrow in FIG. 11). Thus, the fault current may be limited in each of the current-limiting resistor unit modules 100 along the single conductive line.

Further, when a fault current occurs in the power system, a high voltage is applied to the current-limiting resistor. Thus, the high voltage is applied to the current-limiting resistor unit module 100. Therefore, because the high voltage is applied to a portion above the lower base frame 430, the portion may be defined as a 'high voltage portion'. A portion below the lower base frame 430 may be insulated via the first insulating member 470 and the second insulating member 480 and may be grounded to the installation face.

Each support frame 420 is coupled to the main frame 410 as an insulator. However, the support frame 420 supports the current-limiting resistor unit module 100 while contacting the current-limiting resistor unit module 100 as the high voltage portion. Therefore, the support frame 420 may be in an intermediate voltage state (floating state) other than the ground state or the high voltage state. This induced voltage is not good in terms of insulation performance. Therefore, when coupling the support frame 420 to the current-limiting resistor unit module 100 via the conductive material based module coupling link 424, the support frame 420 and the current-limiting resistor unit module 100 have the common mode voltage. This is because it is easier and structurally simpler to allow the support frame 420 and the current-limiting resistor unit module 100 to have the common mode voltage than to ground the support frame 420.

In the tower-shaped support apparatus 400 according to the present disclosure having the above-described configuration, the current-limiting resistor device may be configured based on a required resistance magnitude by varying the number of current-limiting resistor unit modules 100 to be accommodated in the apparatus 400. When configuring the current-limiting resistor unit modules 100 while considering that the required resistance varies depending on the power system to which the current-limiting resistor unit modules 100 are applied, the modular current-limiting resistor device may be easily configured.

As described above, the current-limiting resistor unit module 100 may be constructed such that the resistance thereof is 1 ohm (a). Therefore, as shown in FIG. 11, the modular current-limiting resistor device may be constructed using 8 unit modules 100.

When, as shown in FIG. 11, the modular current-limiting resistor device is constructed using the 8 unit modules 100, and when the modular current-limiting resistor device is activated, a temperature of each unit module 100 rises. When the temperature of the unit module 100 rises and the surrounding air is heated, the heated air ascends.

Accordingly, air flows from a bottom to a top of the tower-shaped support apparatus 400 may occur. Natural convection occurs as cold air from a bottom of the tower-shaped support apparatus 400 is introduced into the modules 100. Each unit module 100 is cooled down as air flows from a bottom of the frame of the module to a top thereof via the natural convection.

Each unit module 100 is constructed such that a plate face of the plate resistor 110 is oriented in a vertical direction in which the natural convection occurs. In other words, the stacking direction of the plate resistors 110 is perpendicular to the vertical direction in the natural convection occurs. Further, in each unit module 100, a spacing may be defined between the stacked plate resistors 110. Therefore, the air rising up due to the natural convection easily passes through the spacing between the plate resistors 110, so that the cooling effect is increased, compared to the conventional current-limiting resistor 1 according to FIG. 1.

The present disclosure as described above may include various substitutions, modifications and changes within the scope of the technical idea of the present disclosure and made by those with ordinary knowledge in the technical field to which the present disclosure belongs. Thus, the scope of the disclosure is not limited to the above embodiments and the accompanying drawings.

What is claimed is:

1. A tower-shaped support apparatus comprising:
a plurality of main frames, each main frame of the plurality of main frames extending in a vertical direction upwardly from an installation face;
a plurality of support frames arranged vertically, each support frame of the plurality of support frames extending in a horizontal direction and coupled to two main frames of the plurality of main frames, wherein a pair of opposing support frames of the plurality of support frames are spaced from each other and are disposed at the same vertical level, and support a corresponding current-limiting resistor unit module of a plurality of current-limiting resistance unit modules limiting a fault current of a power system;
lower frames installed on bottoms of the plurality of main frames, and grounded;

upper frames installed on tops of the plurality of main frames, and grounded;
a plurality of first insulating members respectively installed between the plurality of main frames, the lower frame, and the upper frame to insulate the plurality of main frames and the lower frame and between the plurality of main frames and the upper frame;
a plurality of upper base frames disposed between and coupled to the first insulating members and the plurality of main frames to support the plurality of main frames;
a plurality of second insulating members installed between the plurality of upper base frames facing each other to insulate between the plurality of upper base frames;
a plurality of first busbars including an upper first busbar installed on an upper side of the plurality of main frames and a lower first busbar installed on a lower side of the plurality of main frames to be connected to the power system to introduce a fault current into the plurality of current-limiting resistor unit modules when a fault current occurs; and
a plurality of second busbars installed on the plurality of main frames in a zigzag form between the plurality of first busbars to sequentially energize the plurality of current-limiting resistor unit modules, wherein the zigzag form defines a pattern for a first second busbar, a second second busbar, and a third second busbar of the plurality of second busbars such that:
the first second busbar is connected to a first support frame of the pair of opposing support frames at a first distance from the lower frames and not directly connected to a second frame of the pair of opposing support frames;
the second second busbar is connected to the second frame of the pair of opposing support frames at a second distance from the lower frames and not directly connected to the first support frame of the pair of opposing support frames;
the third second busbar is connected to the first support frame of the pair of opposing support frames at a third distance from the lower frames and not directly connected to the second frame of the pair of opposing support frames; and
wherein the third distance is greater than the first distance;
wherein the second distance overlaps the first distance and the third distance; and
wherein the support frame is formed in a "U"-shaped or "L"-shaped cross section.

2. The tower-shaped support apparatus of claim 1, wherein the pair of opposing support frames support a bottom of a corresponding one of the plurality of current-limiting resistor unit modules.

3. The tower-shaped support apparatus of claim 2, wherein each support frame of the plurality of support frames is made of a conductive material.

4. The tower-shaped support apparatus of claim 3, further comprising a plurality of module coupling links,
wherein each module coupling link of the plurality of module coupling links has one end coupled to a certain support frame of the plurality of support frames using a first bolt, and the other end coupled to a corresponding current-limiting resistor unit module of the plurality of current-limiting resistor unit modules using a second bolt such that the certain support frame and the corresponding current-limiting resistor unit module are coupled to each other via each module coupling link,
wherein each module coupling link has a bar shape and is made of a conductive material.

5. The tower-shaped support apparatus of claim 1, wherein each main frame of the plurality of main frames is made of an insulating material.

6. A tower-shaped support apparatus comprising:
a plurality of main frames, each main frame of the plurality of main frames extending in a vertical direction upwardly from an installation face;
a plurality of support frames arranged vertically, each support frame of the plurality of support frames extending in a horizontal direction and coupled to two main frames of the plurality of main frames, wherein a pair of opposing support frames are spaced from each other and are disposed at the same vertical level, and support a corresponding current-limiting resistor unit module of a plurality of current-limiting resistor unit modules limiting a fault current of a power system;
lower frames installed on bottoms of the plurality of main frames, and grounded;
upper frames installed on tops of the plurality of main frames and grounded;
a plurality of first insulating members respectively installed between the plurality of main frames and the lower frames and between the plurality of main frames and the upper frames to insulate the plurality of main frames and the lower frames from each other and insulate the plurality of main frames and the upper frames from each other; and
a plurality of busbars installed on the main frames to electrically connect the power system and the current-limiting resistor unit modules to each other, including:
a plurality of first busbars installed including an upper first busbar installed on an upper side of the plurality of main frames and a lower first busbar installed a lower side of the plurality of main frames to be connected to the power system, respectively, to introduce a fault current into the plurality of current-limiting resistor unit modules when a fault current occurs; and
a plurality of second busbars installed on the plurality of main frames in a zigzag form between the plurality of first busbars to sequentially energize the current-limiting resistor unit modules, wherein a first busbar of the plurality of second busbars is connected to a first main frame of the plurality of main frames at a first level, a second busbar of the plurality of second busbars is connected to a second main frame of the plurality of main frames at the first level and a second level, and a third busbar of the plurality of second busbars is connected to the first main frame at the second level and a third level, wherein the fault current passes through a first current-limiting resistor unit located at the first level in a first direction and through a second current-limiting resistor unit located at the second level in a second direction opposite to the first direction, wherein the second level is positioned between the first level and the third level in the vertical direction;
wherein the support frame is formed in a "U"-shaped or "L"-shaped cross section.

7. The tower-shaped support apparatus of claim 6, further comprising a plurality of module coupling links,
wherein each link of the plurality of module coupling links has one end coupled to a certain support frame of the plurality of support frames using a first bolt, and the other end coupled to the corresponding current-limiting resistor unit module of the plurality of current-limiting resistor unit modules using a second bolt such that the certain support frame and the corresponding current-limiting resistor unit module are coupled to each other via each link, wherein each link has a bar shape and is made of a conductive material.

8. The tower-shaped support apparatus of claim 6, wherein each of the busbars has one end coupled to a certain main frame the plurality of main frames and the other end coupled to the corresponding current-limiting resistor unit module.

9. The tower-shaped support apparatus of claim 6, further comprising a plurality of upper base frames disposed between and coupled to the first insulating members and the plurality of main frames to support the plurality of main frames.

10. The tower-shaped support apparatus of claim 9, further comprising a plurality of second insulating members installed at the upper base frames, and extending between opposing upper base frames to insulate the opposing upper base frames from each other.

11. The tower-shaped support apparatus of claim 1, wherein the support frame is formed in the "U"-shaped cross-section, having a first member connected to a first main frame of the plurality of main frames, a second member connected to a first side of the first member and bent to extend in the horizontal direction towards a second main frame of the plurality of main frames, and a third member connected to a second side of the first member, opposite to the first side, and bent to extend in the horizontal direction towards the second main frame of the plurality of main frames.

12. The tower-shaped support apparatus of claim 1, wherein the support frame is formed in the "L"-shaped cross-section, having a first member connected to a first main frame of the plurality of main frames, and a second member connected to a side closest to the lower base frames of the first member and bent to extend in the horizontal direction towards a second main frame of the plurality of main frames.

13. The tower-shaped support apparatus of claim 1, wherein sequentially energizing the current-limiting resistor unit modules according to the zigzag form between the plurality of first busbars passes a current in a first direction through a first current-limiting resistor unit module at a first vertical level of the main frames, passes the current in a second direction, opposite to the first direction, through a second current-limiting resistor unit module at a second vertical level of the main frames, and passes the current in the first direction through a third current-limiting resistor unit module at a third vertical level of the main frames, wherein the second current-limiting resistor unit module is vertically disposed between the first current-limiting resistor unit module and the third current-limiting resistor unit module, receives the current from the first current-limiting resistor unit module and provides the current to the third current-limiting resistor unit module.

14. The tower-shaped support apparatus of claim 6, wherein the support frame is formed in the "U"-shaped cross-section, having a first member connected to a first main frame of the plurality of main frames, a second member connected to a first side of the first member and bent to extend in the horizontal direction towards a second main frame of the plurality of main frames, and a third member connected to a second side of the first member, opposite to the first side, and bent to extend in the horizontal direction towards the second main frame of the plurality of main frames.

15. The tower-shaped support apparatus of claim 6, The tower-shaped support apparatus of claim 1, wherein the support frame is formed in the "L"-shaped cross-section, having a first member connected to a first main frame of the plurality of main frames, and a second member connected to a side closest to the lower base frames of the first member and bent to extend in the horizontal direction towards a second main frame of the plurality of main frames.

16. The tower-shaped support apparatus of claim 6, wherein sequentially energizing the current-limiting resistor unit modules according to the zigzag form between the plurality of first busbars passes a current in a first direction through a first current-limiting resistor unit module at a first vertical level of the main frames, passes the current in a second direction, opposite to the first direction, through a second current-limiting resistor unit module at a second vertical level of the main frames, and passes the current in the first direction through a third current-limiting resistor unit module at a third vertical level of the main frames, wherein the second current-limiting resistor unit module is vertically disposed between the first current-limiting resistor unit module and the third current-limiting resistor unit module, receives the current from the first current-limiting resistor unit module and provides the current to the third current-limiting resistor unit module.

17. The tower-shaped support apparatus of claim 1, wherein the plurality of main frames are made from an electrically insulating material.

18. The tower-shaped support apparatus of claim 6, wherein the plurality of main frames are made from an electrically insulating material.

19. A tower-shaped support apparatus comprising:
  a plurality of main frames made from an electrically insulating material and including:
    a first main frame;
    a second main frame;
    a third main frame;
    a fourth main frame;
  a plurality of support frames made from an electrically conductive material and including:
    a first support frame, directly connected to the first main frame and the third main frame at a first level;
    a second support frame, directly connected to the first main frame and the third main frame at a second level;
    a third support frame, directly connected to the second main frame and the fourth main frame at the first level;
    a fourth support frame, directly connected to the second main frame and the fourth main frame at the second level;
  a plurality of current-limiting resistor unit modules that support corresponding pluralities of stacked resistors and including:
    a first current-limiting resistor unit module, supported by and electrically connected between the first support frame and the second support frame between the first level and the second level;
    a second current-limiting resistor unit module, supported by and electrically connected between the third support frame and the fourth support frame between the second level and a third level;

a plurality of busbars made of a conductive material and including:
   a first busbar physically connected to the first main frame and electrically connecting a power system to the first current-limiting resistor unit module;
   a second busbar physically connected the second main frame and electrically connecting the first current-limiting resistor unit module and the second current-limiting module; and
   a third busbar, physically connected to the first main frame and electrically connecting the second current-limiting resistor unit module to one of a third current-limiting resistor unit located at or above the third level or the power system.

* * * * *